(12) United States Patent
Kubota

(10) Patent No.: US 11,631,958 B2
(45) Date of Patent: Apr. 18, 2023

(54) METHOD OF MANUFACTURING SURFACE-EMITTING LASERS, METHOD OF TESTING SURFACE-EMITTING LASERS, AND SURFACE-EMITTING-LASER-TESTING APPARATUS

(71) Applicant: SUMITOMO ELECTRIC INDUSTRIES, LTD., Osaka (JP)

(72) Inventor: Ryosuke Kubota, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/723,680

(22) Filed: Apr. 19, 2022

(65) Prior Publication Data

US 2022/0407284 A1    Dec. 22, 2022

(30) Foreign Application Priority Data

Jun. 16, 2021 (JP) .............................. JP2021-099981

(51) Int. Cl.
| | |
|---|---|
| *H01S 5/00* | (2006.01) |
| *G01J 1/42* | (2006.01) |
| *H01S 5/42* | (2006.01) |

(52) U.S. Cl.
CPC .......... *H01S 5/0014* (2013.01); *G01J 1/4257* (2013.01); *H01S 5/423* (2013.01)

(58) Field of Classification Search
CPC .... H01S 5/0014; H01S 5/0035; H01S 5/0042; H01S 5/42; G01J 1/4257
See application file for complete search history.

(56) References Cited

U.S. PATENT DOCUMENTS

| | | | |
|---|---|---|---|
| 2005/0012923 A1* | 1/2005 | Shiba | G01R 31/311 356/237.5 |
| 2005/0179460 A1 | 8/2005 | Mizukami | |

FOREIGN PATENT DOCUMENTS

JP    2005-235839 A    9/2005

* cited by examiner

*Primary Examiner* — Kevin K Pyo
(74) *Attorney, Agent, or Firm* — Volpe Koenig

(57) ABSTRACT

In a method of manufacturing surface-emitting lasers, a substrate having a major surface including a plurality of areas each provided with a plurality of surface-emitting lasers is prepared. A first laser beam emitted when a direct-current voltage is applied to each of an n number of surface-emitting lasers among the plurality of surface-emitting lasers is measured, n being an integer of 2 or greater. A second laser beam emitted when an alternating-current voltage is applied to each of an m number of surface-emitting lasers among the plurality of surface-emitting lasers is measured, m being a natural number smaller than n. Whether the n number of surface-emitting lasers are each conforming or defective is determined from a result of the measurement of the first laser beam. Whether the m number of surface-emitting lasers are each conforming or defective is determined from a result of the measurement of the second laser beam.

12 Claims, 6 Drawing Sheets

180 # METHOD OF MANUFACTURING SURFACE-EMITTING LASERS, METHOD OF TESTING SURFACE-EMITTING LASERS, AND SURFACE-EMITTING-LASER-TESTING APPARATUS

CROSS REFERENCES TO RELATED APPLICATIONS

The present invention contains subject matter related to Japanese Patent Application No. 2021-099981 filed in the Japan Patent Office on Jun. 16, 2021, the entire contents of which are incorporated herein by reference.

BACKGROUND OF THE INVENTION

1. Field of the Invention

The present disclosure relates to a method of manufacturing surface-emitting lasers, a method of testing surface-emitting lasers, and a surface-emitting-laser-testing apparatus.

2. Description of the Related Art

Japanese Unexamined Patent Application Publication No. 2005-235839 has disclosed a method of testing a semiconductor-device wafer. In this method, a quantum beam is applied to a wafer on which semiconductor-device chips are integrally provided, whereby a thermoelectromotive force is generated in the wafer. The thermoelectromotive force is detected while the position of application of the quantum beam is varied. Subsequently, whether the current or voltage of the measured thermoelectromotive force is greater than a threshold is determined. Positions of the wafer where the current or voltage of the thermoelectromotive force generated with the application of the quantum beam is greater than the threshold are stored as defect address information.

SUMMARY OF THE INVENTION

Whether surface-emitting lasers provided in a wafer are conforming or defective is to be determined from the results of measurement of laser beams emitted when a direct-current voltage is applied to the surface-emitting lasers. However, such a determination with the application of a direct-current voltage is not always enough for appropriate determination of whether the surface-emitting lasers are conforming or defective. In this respect, another method may be considered in which a laser beam emitted when an alternating-current voltage is applied to each of different surface-emitting lasers is measured, and whether the surface-emitting laser is conforming or defective is determined from the result of the measurement. However, it takes a relatively long time to measure a laser beam emitted with the application of an alternating-current voltage. Accordingly, it takes a long time to test a surface-emitting laser.

The present disclosure provides a method of manufacturing surface-emitting lasers, a method of testing surface-emitting lasers, and a surface-emitting-laser-testing apparatus in each of which a time reduction in testing can be achieved.

A method of manufacturing surface-emitting lasers according to an aspect of the present disclosure includes preparing a substrate having a major surface including a plurality of areas in each of which a plurality of surface-emitting lasers are provided; measuring a first laser beam emitted from each of an n number of surface-emitting lasers among the plurality of surface-emitting lasers, the first laser beam being emitted when a direct-current voltage is applied to each of the n number of surface-emitting lasers, n being an integer of 2 or greater; measuring a second laser beam emitted from each of an m number of surface-emitting lasers among the plurality of surface-emitting lasers, the second laser beam being emitted when an alternating-current voltage is applied to each of the m number of surface-emitting lasers, m being a natural number smaller than n; determining whether the n number of surface-emitting lasers are each conforming or defective from a result of the measurement of the first laser beam; and determining whether the m number of surface-emitting lasers are each conforming or defective from a result of the measurement of the second laser beam.

A method of testing surface-emitting lasers according to another aspect of the present disclosure includes preparing a substrate having a major surface including a plurality of areas in each of which a plurality of surface-emitting lasers are provided; measuring a first laser beam emitted from each of an n number of surface-emitting lasers among the plurality of surface-emitting lasers, the first laser beam being emitted when a direct-current voltage is applied to each of the n number of surface-emitting lasers, n being an integer of 2 or greater; measuring a second laser beam emitted from each of an m number of surface-emitting lasers among the plurality of surface-emitting lasers, the second laser beam being emitted when an alternating-current voltage is applied to each of the m number of surface-emitting lasers, m being a natural number smaller than n; determining whether the n number of surface-emitting lasers are each conforming or defective from a result of the measurement of the first laser beam; and determining whether the m number of surface-emitting lasers are each conforming or defective from a result of the measurement of the second laser beam.

A surface-emitting-laser-testing apparatus according to yet another aspect of the present disclosure includes a stage on which a substrate is to be mounted, the substrate having a major surface including a plurality of areas in each of which a plurality of surface-emitting lasers are provided; a first probe through which a direct-current voltage is to be applied to each of an n number of surface-emitting lasers among the plurality of surface-emitting lasers, n being an integer of 2 or greater; a second probe through which an alternating-current voltage is to be applied to each of an m number of surface-emitting lasers among the plurality of surface-emitting lasers, m being a natural number smaller than n; a first measuring instrument configured to measure a first laser beam to be emitted from each of the n number of surface-emitting lasers; a second measuring instrument configured to measure a second laser beam to be emitted from each of the m number of surface-emitting lasers; and a determining device configured to determine whether the n number of surface-emitting lasers are each conforming or defective from the result of the measurement of the first laser beam and to determine whether the m number of surface-emitting lasers are each conforming or defective from the result of the measurement of the second laser beam.

DESCRIPTION OF THE PREFERRED EMBODIMENTS

Description of Embodiments of Present Disclosure

Figure 1:
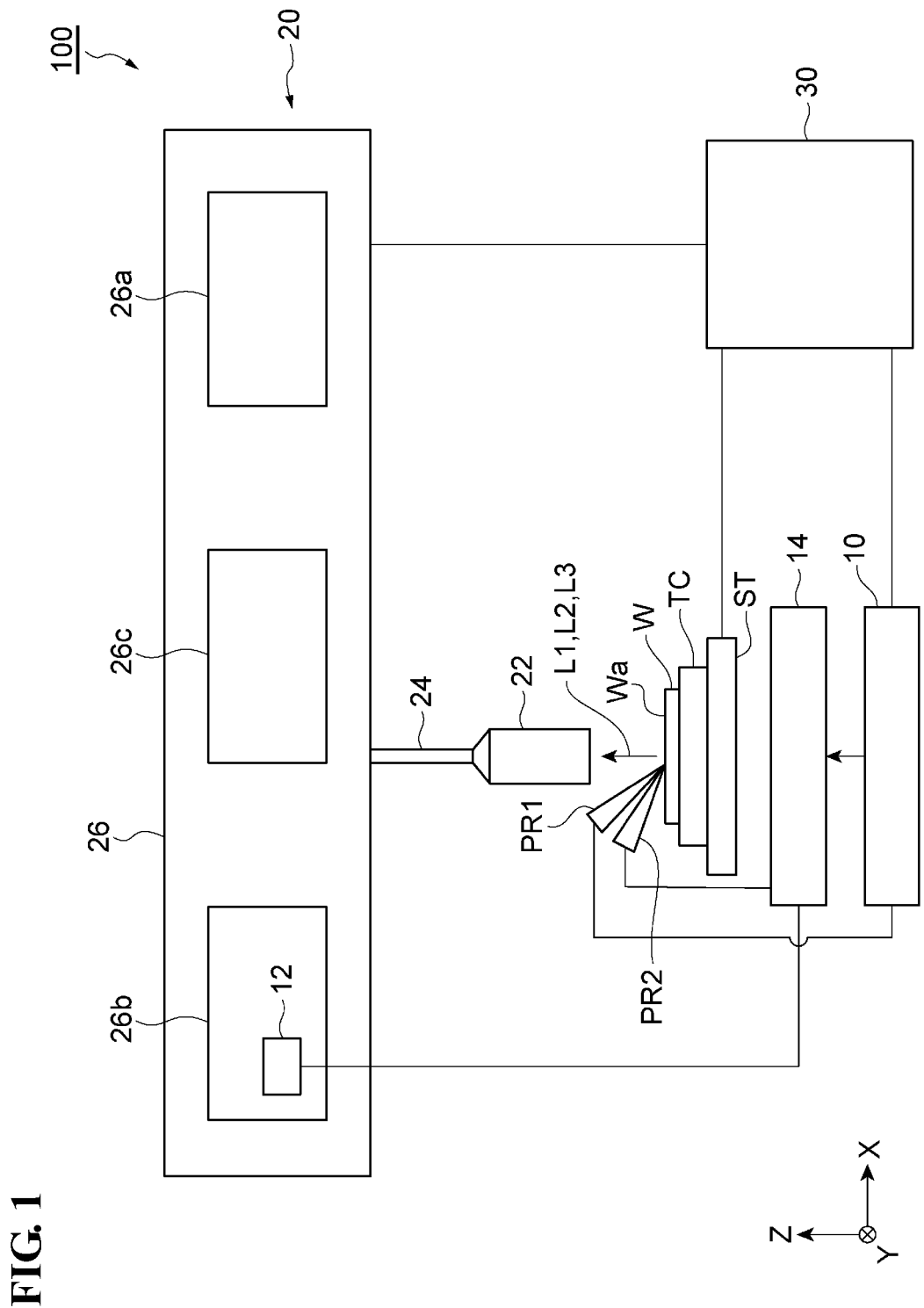
FIG. 1 schematically illustrates a surface-emitting-laser-testing apparatus according to a first embodiment.

A method of manufacturing surface-emitting lasers according to an embodiment includes preparing a substrate having a major surface including a plurality of areas in each of which a plurality of surface-emitting lasers are provided; measuring a first laser beam emitted from each of an n number of surface-emitting lasers among the plurality of surface-emitting lasers, the first laser beam being emitted when a direct-current voltage is applied to each of the n number of surface-emitting lasers, n being an integer of 2 or greater; measuring a second laser beam emitted from each of an m number of surface-emitting lasers among the plurality of surface-emitting lasers, the second laser beam being emitted when an alternating-current voltage is applied to each of the m number of surface-emitting lasers, m being a natural number smaller than n; determining whether the n number of surface-emitting lasers are each conforming or defective from a result of the measurement of the first laser beam; and determining whether the m number of surface-emitting lasers are each conforming or defective from a result of the measurement of the second laser beam.

In the above manufacturing method of manufacturing surface-emitting lasers, since the number (m) of surface-emitting lasers to be subjected to the measurement of the second laser beam is small, the measurement of the second laser beam, which tends to require a relatively long time, can be finished in a reduced time. Accordingly, a time reduction in the testing of surface-emitting lasers can be achieved.

The above manufacturing method may further include measuring a third laser beam emitted from each of the m number of surface-emitting lasers, the third laser beam being emitted when a direct-current voltage is applied to each of the m number of surface-emitting lasers; and determining whether the m number of surface-emitting lasers are each conforming or defective from a result of the measurement of the third laser beam. In such a case, since the number (m) of surface-emitting lasers to be subjected to the measurement of the third laser beam is small, the measurement of the third laser beam, which tends to require a relatively long time, can be finished in a reduced time.

The above manufacturing method may further include determining passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater. The measurement of the second laser beam, the determination of whether the m number of surface-emitting lasers are each conforming or defective from the result of the measurement of the second laser beam, the measurement of the third laser beam, and the determination of whether the m number of surface-emitting lasers are each conforming or defective from the result of the measurement of the third laser beam may be performed for the passed areas. In such a case, since the number (m) of surface-emitting lasers to be subjected to the measurement of the second laser beam is further reduced, the measurement of the second laser beam can be finished in a further reduced time.

The above manufacturing method may further include determining passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater. The measurement of the second laser beam, and the determination of whether the m number of surface-emitting lasers are each conforming or defective from the result of the measurement of the second laser beam may be performed for the passed areas. In such a case, since the number (m) of surface-emitting lasers to be subjected to the measurements of the second laser beam and the third laser beam is further reduced, the measurements of the second laser beam and the third laser beam can each be finished in a further reduced time.

A method of testing surface-emitting lasers according to another embodiment includes preparing a substrate having a major surface including a plurality of areas in each of which a plurality of surface-emitting lasers are provided; measuring a first laser beam emitted from each of an n number of surface-emitting lasers among the plurality of surface-emitting lasers, the first laser beam being emitted when a direct-current voltage is applied to each of the n number of surface-emitting lasers, n being an integer of 2 or greater; measuring a second laser beam emitted from each of an m number of surface-emitting lasers among the plurality of surface-emitting lasers, the second laser beam being emitted when an alternating-current voltage is applied to each of the m number of surface-emitting lasers, m being a natural number smaller than n; determining whether the n number of surface-emitting lasers are each conforming or defective from a result of the measurement of the first laser beam; and determining whether the m number of surface-emitting lasers are each conforming or defective from a result of the measurement of the second laser beam.

In the above method of testing surface-emitting lasers, since the number (m) of surface-emitting lasers to be subjected to the measurement of the second laser beam is small, the measurement of the second laser beam, which tends to require a relatively long time, can be finished in a reduced time. Accordingly, a time reduction in the testing of surface-emitting lasers can be achieved.

A surface-emitting-laser-testing apparatus according to yet another embodiment includes a stage on which a substrate is to be mounted, the substrate having a major surface including a plurality of areas in each of which a plurality of surface-emitting lasers are provided; a first probe through which a direct-current voltage is to be applied to each of an n number of surface-emitting lasers among the plurality of surface-emitting lasers, n being an integer of 2 or greater; a second probe through which an alternating-current voltage is to be applied to each of an m number of surface-emitting lasers among the plurality of surface-emitting lasers, m being a natural number smaller than n; a first measuring instrument configured to measure a first laser beam to be emitted from each of the n number of surface-emitting lasers; a second measuring instrument configured to measure a second laser beam to be emitted from each of the m number of surface-emitting lasers; and a determining device configured to determine whether the n number of surface-emitting lasers are each conforming or defective from the result of the measurement of the first laser beam and to determine whether the m number of surface-emitting lasers are each conforming or defective from the result of the measurement of the second laser beam.

In the above surface-emitting-laser-testing apparatus, since the number (m) of surface-emitting lasers to be subjected to the measurement of the second laser beam is small, the measurement of the second laser beam, which tends to require a relatively long time, can be finished in a reduced time. Accordingly, a time reduction in the testing of surface-emitting lasers can be achieved.

Details of Embodiments of Present Disclosure

Embodiments of the present disclosure will now be described in detail with reference to the accompanying drawings. In the following description given with reference to the drawings, the same or equivalent elements are denoted by the same reference signs, respectively, and redundant description of such elements is omitted. The drawings are provided with an X-Y-Z Cartesian coordinate system according to need.

FIG. 1 schematically illustrates a surface-emitting-laser-testing apparatus according to a first embodiment. The surface-emitting-laser-testing apparatus, 100, illustrated in FIG. 1 includes a stage ST, on which a substrate W is to be mounted. The stage ST may be movable in the X-axis direction and in the Y-axis direction. The substrate W may be mounted on a ThermoChuck TC, which is to be provided between the substrate W and the stage ST. The ThermoChuck TC is capable of adjusting the temperature of the substrate W.

Figure 2:
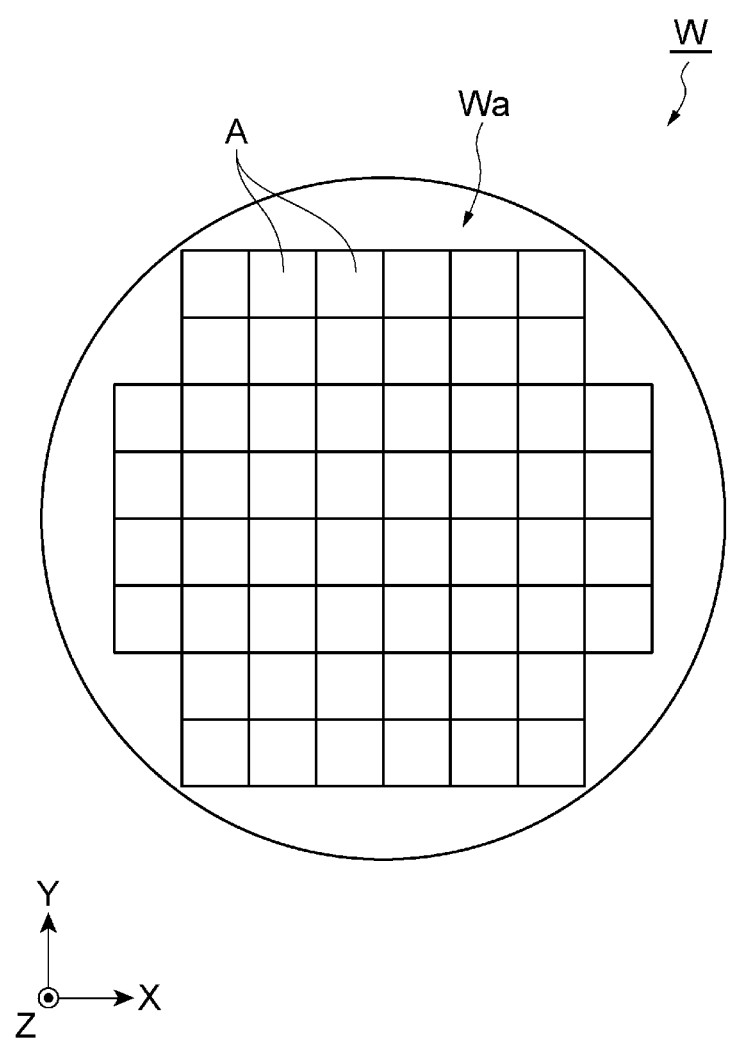
FIG. 2 is a schematic plan view of an exemplary substrate including surface-emitting lasers to be tested.
Figure 3:
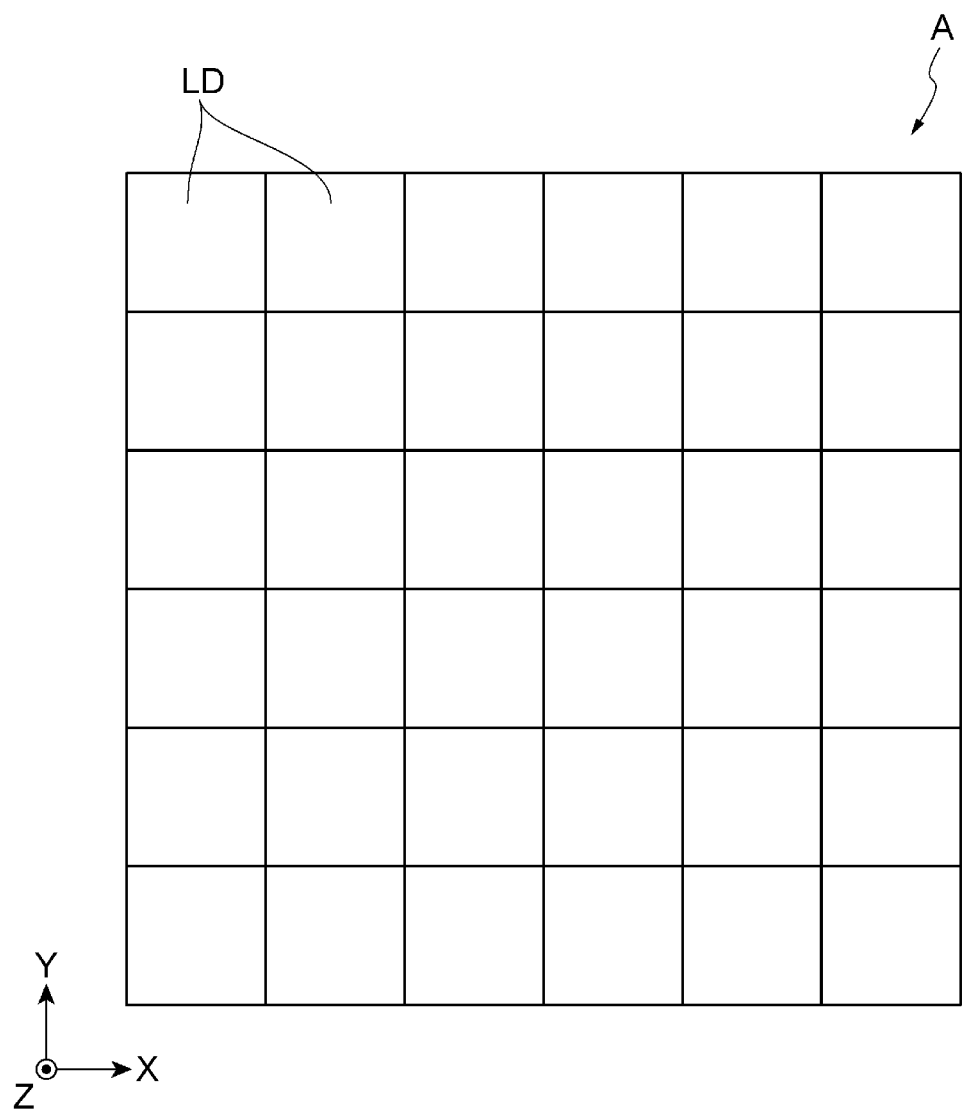
FIG. 3 is a plan view of one of areas defined on a major surface of the substrate illustrated in FIG. 2.

The substrate W is, for example, a III-V compound semiconductor substrate. The substrate W has a major surface Wa. As illustrated in FIG. 2, the major surface Wa includes a plurality of areas A. The plurality of areas A are arranged in a matrix with reference to the X axis and the Y axis. As illustrated in FIG. 3, the plurality of areas A are each provided with a plurality of surface-emitting lasers LD. The plurality of surface-emitting lasers LD are arranged in a matrix with reference to the X axis and the Y axis. The surface-emitting lasers LD are each, for example, a vertical-cavity surface-emitting laser. A single substrate W includes, for example, thirty thousand or more surface-emitting lasers LD. A single area A is provided with, for example, five hundred or more surface-emitting lasers LD.

The testing apparatus 100 includes two first probes PR1, through which a direct-current voltage is to be applied to the individual surface-emitting lasers LD. The first probes PR1 may be connected to a direct-current power source 10. The tips of the two first probes PR1 are to be brought into contact with a first electrode and a second electrode, respectively, included in each of the surface-emitting lasers LD. The first electrode is connected to a p-semiconductor layer included in the surface-emitting laser LD. The second electrode is connected to an n-semiconductor layer included in the surface-emitting laser LD.

The testing apparatus 100 includes two second probes PR2, through which an alternating-current voltage is to be applied to the individual surface-emitting lasers LD. The second probes PR2 may be connected to an alternating-current power source 12. The tips of the two second probes PR2 are to be brought into contact with the first electrode and the second electrode, respectively, included in each of the surface-emitting lasers LD. A bias tee 14 may be provided between the alternating-current power source 12 and the second probes PR2. The bias tee 14 is connected to the direct-current power source 10.

The testing apparatus 100 includes a measuring device 20, which is configured to measure a laser beam (a first laser beam L1, a second laser beam L2, or a third laser beam L3) to be emitted from each of the surface-emitting lasers LD in the Z-axis direction. The measuring device 20 may include a lens 22 and a measuring instrument 26. The measuring instrument 26 is connected to the lens 22 with an optical fiber 24. The lens 22 receives the laser beam. The laser beam received by the lens 22 travels through the optical fiber 24 and reaches the measuring instrument 26.

The measuring instrument 26 includes a first measuring instrument 26a and a second measuring instrument 26b. The first measuring instrument 26a may be a power meter configured to measure the intensity of the first laser beam L1, or may be a spectroscope or an optical-spectrum analyzer configured to measure the wavelength of the first laser beam L1. The second measuring instrument 26b may be a lightwave component analyzer (LCA) configured to measure the high-frequency characteristic of the second laser beam L2. The second measuring instrument 26b may include the alternating-current power source 12. The measuring instrument 26 may further include a third measuring instrument 26c. The third measuring instrument 26c may be a relative-intensity-noise (RIN)-measuring system configured to measure the relative intensity noise of the third laser beam L3.

The testing apparatus 100 includes a control device 30. The control device 30 may be a determining device configured to determine whether the surface-emitting lasers LD are each conforming or defective from the results of the measurements of the first to third laser beams L1 to L3 performed by the measuring device 20. The control device 30 includes, for example, a processor. The control device 30 is configured to control the stage ST, the direct-current power source 10, and the measuring device 20 individually.

Figure 4:
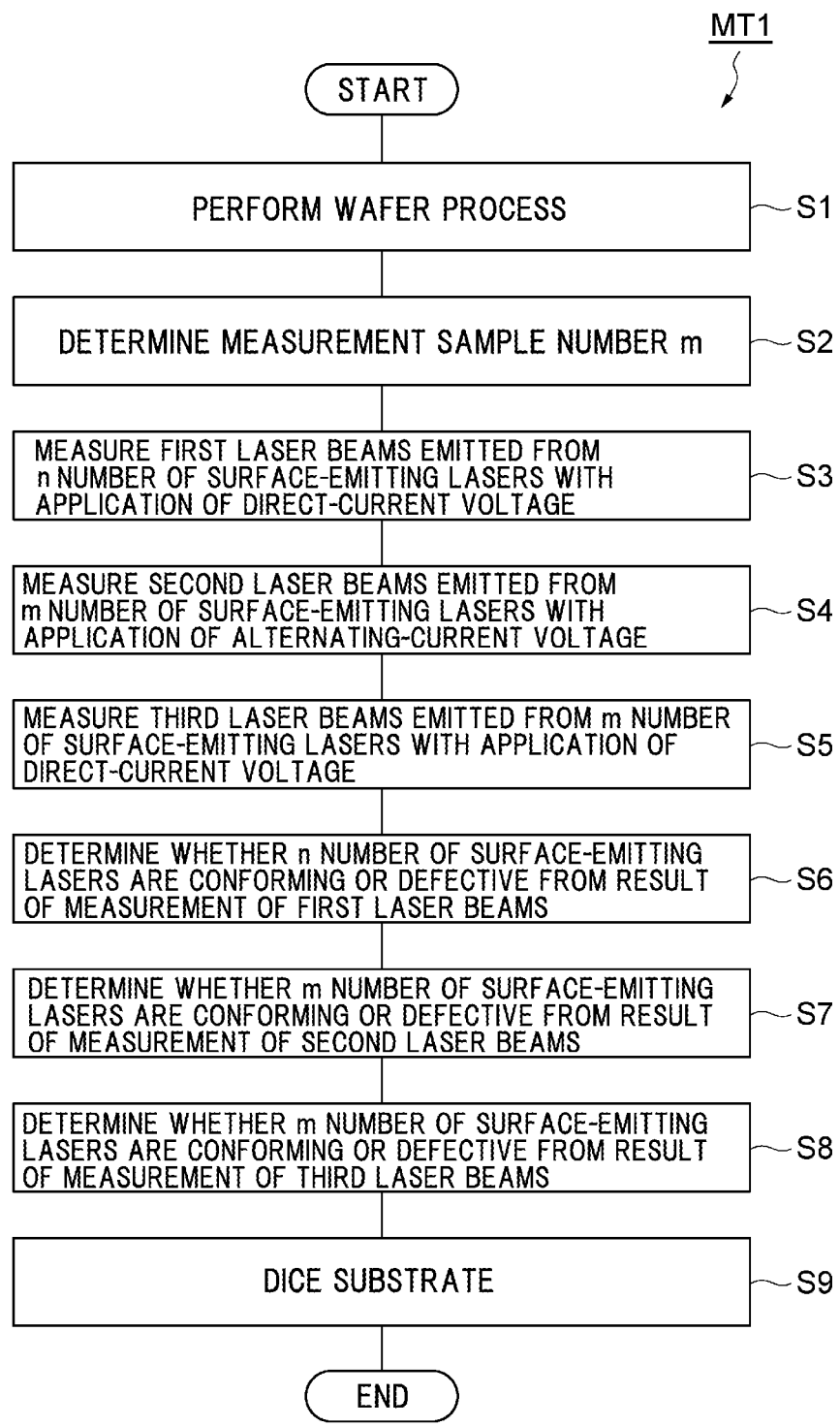
FIG. 4 is a flow chart illustrating a method of manufacturing surface-emitting lasers according to the first embodiment.

FIG. 4 is a flow chart illustrating a method of manufacturing surface-emitting lasers according to the first embodiment. The method, MT1, of manufacturing surface-emitting lasers (hereinafter simply referred to as the method MT1) illustrated in FIG. 4 includes a method of testing surface-emitting lasers according to the first embodiment. The method MT1 may include Steps S1 to S9. Steps S1 to S9 may be performed in that order. Step S1, Step S2, Step S5, Step S8, and Step S9 may be omitted. The method MT1 may be performed by using the testing apparatus 100. In the method MT1, surface-emitting lasers LD are manufactured as follows.

First, a wafer process is performed on a substrate W (Step S1). The wafer process includes, for example, film deposition, photolithography, etching, and so forth. In Step S1, a substrate W including a plurality of surface-emitting lasers LD is prepared.

Subsequently, a measurement sample number m is determined (Step S2). The measurement sample number m refers to the number of surface-emitting lasers LD to be measured in each of Step S4 and Step S5. Step S2 may be performed before Step S1. The measurement sample number m may be a product of the number of samples to be measured in a single area A and the total number of areas A.

The measurement sample number m may be determined such that a producer's risk α and a consumer's risk β each being a target value or lower are achieved. For example, the measurement sample number m may be determined such that a consumer's risk β of 10% or lower and a producer's risk α of 5% or lower are achieved. Exemplary preconditions are as follows.

(Preconditions)
Tolerable number k of defectives: 1
Percentage of laser-beam wavelength falling within tolerable range: 90%
Lot tolerance percent defective (LTPD): 10%
Acceptable quality limit (AQL): 5% or lower For example, if AQL is 0.71% and the measurement sample number m is 56, β is 3.38% and α is 4.93%. The producer's risk α and the consumer's risk β in this case are each a target value or lower.

Subsequently, a direct-current voltage is applied to each of an n number of surface-emitting lasers LD among the plurality of surface-emitting lasers LD, and a first laser beam L1 emitted from each of the n number of surface-emitting lasers LD is measured (Step S3). Here, n is an integer of 2 or greater. Furthermore, n may be the number of all the plurality of surface-emitting lasers LD included in the substrate W. In Step S3, at least one of the following is measured: the intensity of the first laser beam L1, the oscillation wavelength of the first laser beam L1, and the spectral band width of the first laser beam L1. Step S3 may be performed before Step S2.

Step S3 may be performed by using the testing apparatus 100 illustrated in FIG. 1. When a direct-current voltage is applied through the first probes PR1 to a surface-emitting laser LD of interest, a first laser beam L1 is emitted from the surface-emitting laser LD of interest. The first laser beam L1 is measured by the first measuring instrument 26a. The result of the measurement of the first laser beams L1 is transmitted from the first measuring instrument 26a to the control device 30. The control device 30 transmits a signal for controlling the first measuring instrument 26a to the first measuring instrument 26a. The control device 30 transmits a signal for controlling the direct-current power source 10 to the direct-current power source 10. Data on the current and the voltage applied to the surface-emitting lasers LD is transmitted from the direct-current power source 10 to the control device 30.

The intensity of the first laser beam L1 is measured while the direct-current voltage applied to each of the surface-emitting lasers LD of interest is varied from, for example, zero volts to several volts. The oscillation wavelength and the spectral band width of the first laser beam L1 are measured while a predetermined bias current is supplied to the surface-emitting laser LD. The oscillation wavelength of the first laser beam L1 ranges from, for example, 800 nm to 950 nm.

Subsequently, an alternating-current voltage is applied to each of an m number of surface-emitting lasers LD among the plurality of surface-emitting lasers LD, and a second laser beam L2 emitted from each of the m number of surface-emitting lasers LD is measured (Step S4). Here, m is a natural number smaller than n. Furthermore, m is the measurement sample number m determined in Step S2. In Step S4, changes (followability) in the intensity of the second laser beam L2 with respect to changes in the frequency of the alternating-current voltage are measured. For example, changes in the intensity of the second laser beam L2 may be measured while the frequency of the alternating-current voltage is varied from several MHz to 50 GHz. Step S4 may be performed before Step S3.

Step S4 may be performed by using the testing apparatus 100 illustrated in FIG. 1. When an alternating-current voltage is applied through the second probes PR2 to a surface-emitting laser LD of interest, a second laser beam L2 is emitted from the surface-emitting laser LD of interest. The second laser beam L2 is measured by the second measuring instrument 26b. The result of the measurement of the second laser beam L2 is transmitted from the second measuring instrument 26b to the control device 30. The control device 30 transmits a signal for controlling the second measuring instrument 26b to the second measuring instrument 26b. The second measuring instrument 26b transmits a high-frequency signal to each of the surface-emitting lasers LD of interest. The control device 30 transmits a signal for controlling the direct-current power source 10 to the direct-current power source 10.

Subsequently, a direct-current voltage is applied to each of the m number of surface-emitting lasers LD, and a third laser beam L3 emitted from each of the m number of surface-emitting lasers LD is measured (Step S5). In Step S5, the relative intensity noise of the third laser beam L3 is measured. Step S5 may be performed before Step S4.

Step S5 may be performed by using the testing apparatus 100 illustrated in FIG. 1. When a direct-current voltage is applied through the first probes PR1 to a surface-emitting laser LD of interest, a third laser beam L3 is emitted from the surface-emitting laser LD of interest. The third laser beam L3 is measured by the third measuring instrument 26c. The result of the measurement of the third laser beam L3 is transmitted from the third measuring instrument 26c to the control device 30. The control device 30 transmits a signal for controlling the third measuring instrument 26c to the third measuring instrument 26c. The control device 30 transmits a signal for controlling the direct-current power source 10 to the direct-current power source 10.

Subsequently, whether the n number of surface-emitting lasers LD are each conforming or defective is determined (Step S6) from the result of the measurement of the first laser beam L1 obtained in Step S3. For example, if the oscillation wavelength of a first laser beam L1 of interest is within the tolerable range, a corresponding one of the surface-emitting lasers LD is determined to be conforming. Step S6 may be performed before Step S5 or Step S4. In Step S6, if the percentage of conforming surface-emitting lasers LD is lower than a threshold, the number of conforming surface-emitting lasers LD included in the substrate W is regarded as small. Therefore, the substrate W as a whole may be disposed of.

Subsequently, whether the m number of surface-emitting lasers LD are each conforming or defective is determined (Step S7) from the result of the measurement of the second laser beam L2 obtained in Step S4. For example, if changes in the intensity of a second laser beam L2 of interest with respect to changes in the frequency of the alternating-current voltage are within the tolerable range, a corresponding one of the surface-emitting lasers LD is determined to be conforming. Step S7 may be performed before Step S6 or Step S5.

Subsequently, whether the m number of surface-emitting lasers LD are each conforming or defective is determined (Step S8) from the result of the measurement of the third laser beam L3 obtained in Step S5. For example, if the relative intensity noise of a third laser beam L3 of interest is within the tolerable range, a corresponding one of the surface-emitting lasers LD is determined to be conforming. Step S8 may be performed before Step S7 or Step S6.

Subsequently, the substrate W is diced (Step S9). Thus, the plurality of surface-emitting lasers LD are separated from one another. Consequently, chips each including a single surface-emitting laser LD or arrays each including a plurality of surface-emitting lasers LD are obtained. Surface-emitting lasers LD determined to be conforming in all of Steps S6 to S8 are sorted out to be shipped as finished products. Alternatively, for substrates W in each of which the number of surface-emitting lasers LD determined to be defective in Step S7 is k or smaller (k is the tolerable number of defectives that is set as a precondition), surface-emitting lasers LD determined to be conforming in Step S6 may all be shipped as finished products, except those that are determined to be defective in Step S7. In such a case, surface-emitting lasers LD that are not subjected to the measurement of the second laser beams L2 may also be included in the finished products. As another alternative, for substrates W in each of which the number of surface-emitting lasers LD determined to be defective in Step S8 is k or smaller, surface-emitting lasers LD determined to be conforming in Step S6 may all be shipped as finished products, except those that are determined to be defective in Step S8. In such a case, surface-emitting lasers LD that are not subjected to the measurement of the third laser beam L3 may also be included in the finished products.

In the method MT1, since the number (m) of surface-emitting lasers LD to be subjected to the measurement of the second laser beam L2 is small, the measurement of the second laser beam L2, which tends to require a relatively long time, can be finished in a reduced time. Furthermore, even if Step S5 and Step S8 are to be performed, the number (m) of the surface-emitting lasers LD to be subjected to the measurement of the third laser beam L3 is small. Therefore, the measurement of the third laser beam L3, which tends to require a relatively long time, can be finished in a reduced time. Thus, a time reduction in the testing of surface-emitting lasers LD can be achieved. Accordingly, a time reduction in the manufacturing of surface-emitting lasers LD can be achieved.

Figure 5:
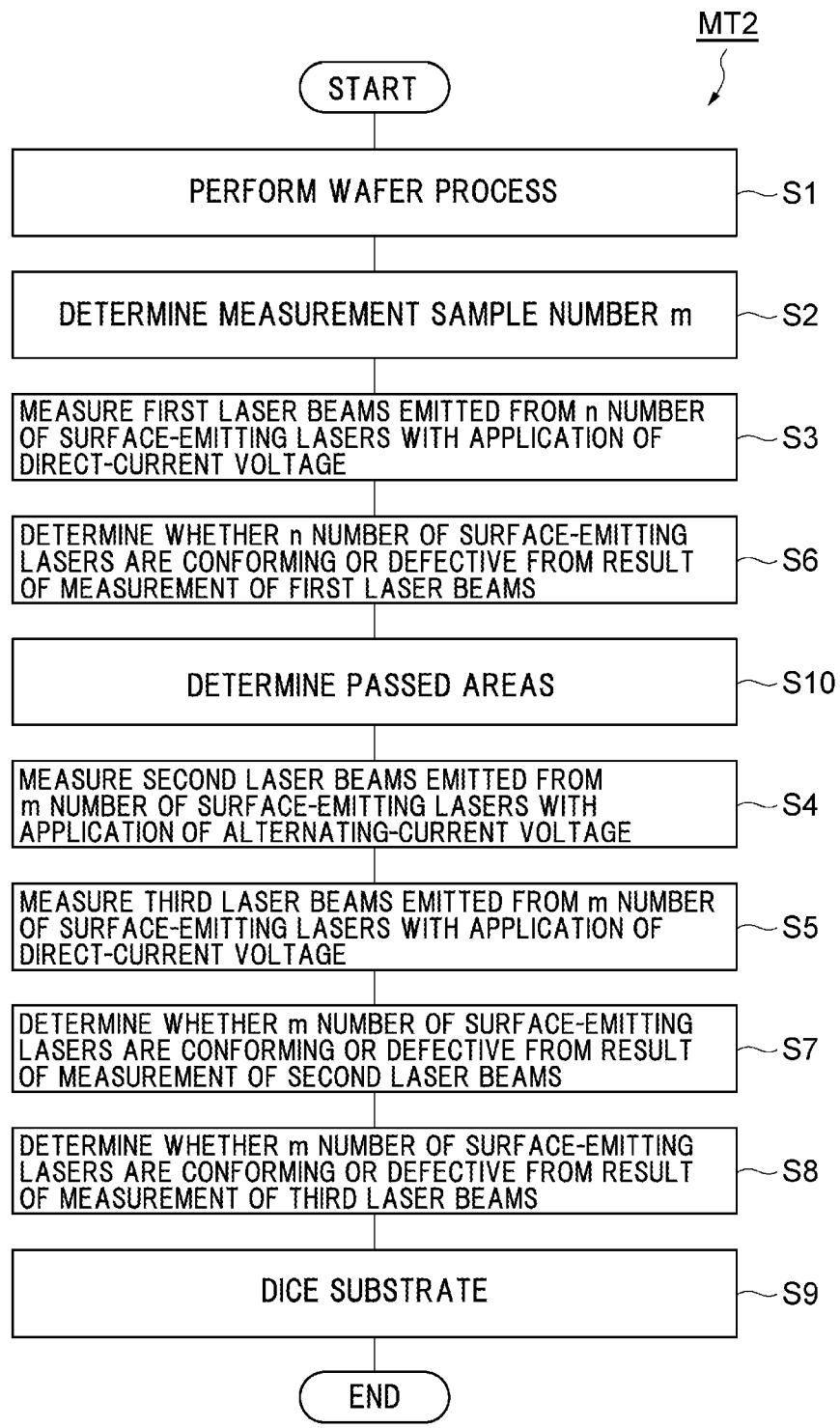
FIG. 5 is a flow chart illustrating a method of manufacturing surface-emitting lasers according to a second embodiment.
Figure 6:
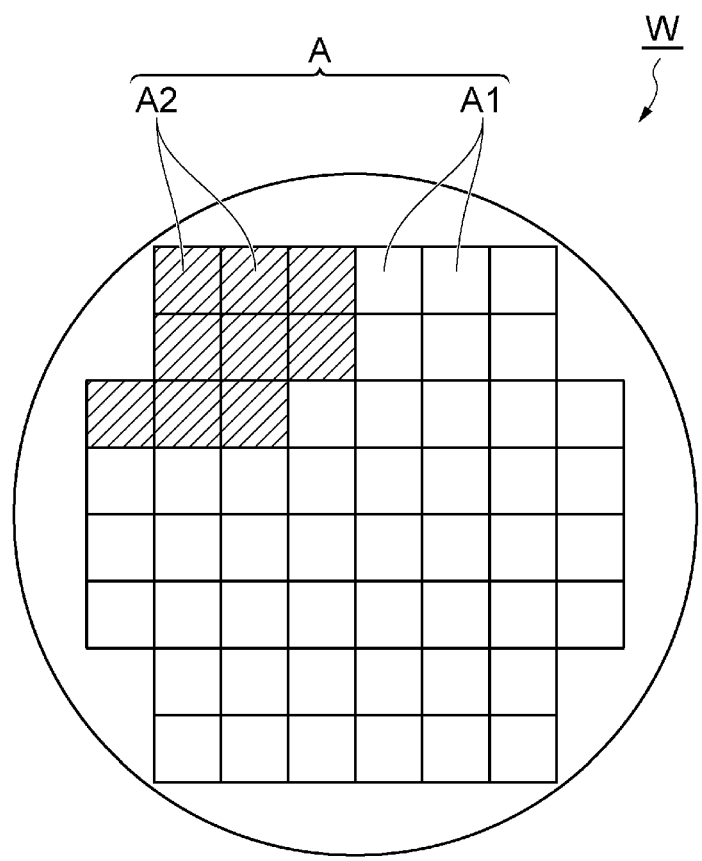
FIG. 6 is a schematic plan view of an exemplary substrate including surface-emitting lasers to be tested in the method of manufacturing surface-emitting lasers according to the second embodiment.

FIG. 5 is a flow chart illustrating a method of manufacturing surface-emitting lasers according to a second embodiment. FIG. 6 is a schematic plan view of an exemplary substrate including surface-emitting lasers to be tested in the method of manufacturing surface-emitting lasers according to the second embodiment. The method, MT2, of manufacturing surface-emitting lasers (hereinafter simply referred to as the method MT2) illustrated in FIG. 5 may include Steps S1 to S3, Step S6, Step S10, Step S4, Step S5, and Steps S7 to S9. Steps S1 to S3, Step S6, Step S10, Step S4, Step S5, and Steps S7 to S9 may be performed in that order. Step S1, Step S2, Step S5, Step S8, and Step S9 may be omitted. The method MT2 may be performed by using the testing apparatus 100. In the method MT2, surface-emitting lasers LD are manufactured as follows.

First, as with the case of the method MT1, Steps S1 to S3 are performed. Subsequently, Step S6, which is the same as that in the method MT1, is performed.

Subsequently, among the plurality of areas A, areas A in each of which the number of surface-emitting lasers LD determined to be conforming in Step S6 reaches a threshold or greater are determined to be passed areas A1 (see FIG. 6) (Step S10). Among the plurality of areas A, those other than the passed areas A1 are determined to be failed areas A2.

Subsequently, an alternating-current voltage is applied to each of the m number of surface-emitting lasers LD that are included in the passed areas A1, and a second laser beam L2 emitted from each of the m number of surface-emitting lasers LD is measured (Step S4).

Subsequently, a direct-current voltage is applied to each of the m number of surface-emitting lasers LD that are included in the passed areas A1, and a third laser beam L3 emitted from each of the m number of surface-emitting lasers LD is measured (Step S5). Step S5 may be performed before Step S4.

Subsequently, whether the m number of surface-emitting lasers LD that are included in the passed areas A1 are each conforming or defective is determined (Step S7) from the result of the measurement of the second laser beam L2. Step S7 may be performed before Step S5.

Subsequently, whether the m number of surface-emitting lasers LD that are included in the passed areas A1 are each conforming or defective is determined from the result of the measurement of the third laser beam L3 (Step S8). Step S8 may be performed before Step S7.

Subsequently, Step S9, which is the same as that in the method MT1, is performed.

In the method MT2, a time reduction in the testing of surface-emitting lasers LD can be achieved, as with the case of the method MT1. Furthermore, there is no need to perform Step S4, Step S5, Step S7, and Step S8 for the failed areas A2. Accordingly, the number (m) of surface-emitting lasers LD to be subjected to the measurements of the second laser beam L2 and the third laser beam L3 is further reduced. Therefore, the measurements of the second laser beam L2 and the third laser beam L3 can each be finished in a further reduced time.

While preferable embodiments of the present disclosure have been described in detail, the present disclosure is not limited to the above embodiments.

The embodiments disclosed herein are only exemplary in all respects and should be considered as nonlimiting. The scope of the present invention is defined by the appended claims, not by the above description, and is intended to include all changes that are made thereto in terms of and within the range of equivalents to the claims.

What is claimed is:

1. A method of manufacturing surface-emitting lasers, comprising:
   preparing a substrate having a major surface including a plurality of areas in each of which a plurality of surface-emitting lasers are provided;
   measuring a first laser beam emitted from each of an n number of surface-emitting lasers among the plurality of surface-emitting lasers, the first laser beam being emitted when a direct-current voltage is applied to each of the n number of surface-emitting lasers, n being an integer of 2 or greater;
   measuring a second laser beam emitted from each of an m number of surface-emitting lasers among the plurality of surface-emitting lasers, the second laser beam being emitted when an alternating-current voltage is applied to each of the m number of surface-emitting lasers, m being a natural number smaller than n;
   determining whether the n number of surface-emitting lasers are each conforming or defective from a result of the measurement of the first laser beam; and
   determining whether the m number of surface-emitting lasers are each conforming or defective from a result of the measurement of the second laser beam.

2. The method of manufacturing surface-emitting lasers according to claim 1, further comprising:
   measuring a third laser beam emitted from each of the m number of surface-emitting lasers, the third laser beam being emitted when a direct-current voltage is applied to each of the m number of surface-emitting lasers; and
   determining whether the m number of surface-emitting lasers are each conforming or defective from a result of the measurement of the third laser beam.

3. The method of manufacturing surface-emitting lasers according to claim 2, further comprising:
  determining passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater,
  wherein the measurement of the second laser beam, the determination of whether the m number of surface-emitting lasers are each conforming or defective from the result of the measurement of the second laser beam, the measurement of the third laser beam, and the determination of whether the m number of surface-emitting lasers are each conforming or defective from the result of the measurement of the third laser beam are performed for the passed areas.

4. The method of manufacturing surface-emitting lasers according to claim 1, further comprising:
  determining passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater,
  wherein the measurement of the second laser beam, and the determination of whether the m number of surface-emitting lasers are each conforming or defective from the result of the measurement of the second laser beam are performed for the passed areas.

5. A method of testing surface-emitting lasers, comprising:
  preparing a substrate having a major surface including a plurality of areas in each of which a plurality of surface-emitting lasers are provided;
  measuring a first laser beam emitted from each of an n number of surface-emitting lasers among the plurality of surface-emitting lasers, the first laser beam being emitted when a direct-current voltage is applied to each of the n number of surface-emitting lasers, n being an integer of 2 or greater;
  measuring a second laser beam emitted from each of an m number of surface-emitting lasers among the plurality of surface-emitting lasers, the second laser beam being emitted when an alternating-current voltage is applied to each of the m number of surface-emitting lasers, m being a natural number smaller than n;
  determining whether the n number of surface-emitting lasers are each conforming or defective from a result of the measurement of the first laser beam; and
  determining whether the m number of surface-emitting lasers are each conforming or defective from a result of the measurement of the second laser beam.

6. The method of testing surface-emitting lasers according to claim 5, further comprising:
  measuring a third laser beam emitted from each of the m number of surface-emitting lasers, the third laser beam being emitted when a direct-current voltage is applied to each of the m number of surface-emitting lasers; and
  determining whether the m number of surface-emitting lasers are each conforming or defective from a result of the measurement of the third laser beam.

7. The method of testing surface-emitting lasers according to claim 6, further comprising:
  determining passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater,
  wherein the measurement of the second laser beam, the determination of whether the m number of surface-emitting lasers are each conforming or defective from the result of the measurement of the second laser beam, the measurement of the third laser beam, and the determination of whether the m number of surface-emitting lasers are each conforming or defective from the result of the measurement of the third laser beam are performed for the passed areas.

8. The method of testing surface-emitting lasers according to claim 5, further comprising:
  determining passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater,
  wherein the measurement of the second laser beam, and the determination of whether the m number of surface-emitting lasers are each conforming or defective from the result of the measurement of the second laser beam are performed for the passed areas.

9. A surface-emitting-laser-testing apparatus, comprising:
  a stage on which a substrate is to be mounted, the substrate having a major surface including a plurality of areas in each of which a plurality of surface-emitting lasers are provided;
  a first probe through which a direct-current voltage is to be applied to each of an n number of surface-emitting lasers among the plurality of surface-emitting lasers, n being an integer of 2 or greater;
  a second probe through which an alternating-current voltage is to be applied to each of an m number of surface-emitting lasers among the plurality of surface-emitting lasers, m being a natural number smaller than n;
  a first measuring instrument configured to measure a first laser beam to be emitted from each of the n number of surface-emitting lasers;
  a second measuring instrument configured to measure a second laser beam to be emitted from each of the m number of surface-emitting lasers; and
  a determining device configured to determine whether the n number of surface-emitting lasers are each conforming or defective from the result of the measurement of the first laser beam and to determine whether the m number of surface-emitting lasers are each conforming or defective from the result of the measurement of the second laser beam.

10. The surface-emitting-laser-testing apparatus according to claim 9,
  wherein the surface-emitting-laser-testing apparatus is configured to measure a third laser beam emitted from each of the m number of surface-emitting lasers, the third laser beam being emitted when a direct-current voltage is applied to each of the m number of surface-emitting lasers; and wherein the surface-emitting-laser-testing apparatus is configured to determine whether the m number of surface-emitting lasers are each conforming or defective from a result of the measurement of the third laser beam.

11. The surface-emitting-laser-testing apparatus according to claim 10,
wherein the surface-emitting-laser-testing apparatus is configured to determine passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater; and
wherein the measurement of the second laser beam, the determination of whether the m number of surface-emitting lasers are each conforming or defective from the result of the measurement of the second laser beam, the measurement of the third laser beam, and the determination of whether the m number of surface-emitting lasers are each conforming or defective from the result of the measurement of the third laser beam are performed for the passed areas.

12. The surface-emitting-laser-testing apparatus according to claim 9,
wherein the surface-emitting-laser-testing apparatus is configured to determine passed areas among the plurality of areas, the passed areas each including surface-emitting lasers determined to be conforming in the determination of whether the n number of surface-emitting lasers are each conforming or defective, a number of conforming surface-emitting lasers in each of the passed areas reaching a threshold or greater; and
wherein the measurement of the second laser beam, and the determination of whether the m number of surface-emitting lasers are each conforming or defective from the result of the measurement of the second laser beam are performed for the passed areas.

* * * * *